(12) United States Patent
Sumi

(10) Patent No.: US 6,486,741 B2
(45) Date of Patent: Nov. 26, 2002

(54) PRECISE PHASE COMPARISON EVEN WITH FRACTIONAL FREQUENCY DIVISION RATIO

(75) Inventor: Yasuaki Sumi, Tottori (JP)

(73) Assignees: Sanyo Electric Co., Ltd., Osaka-fu (JP); Tottori Sanyo Electric Co., Ltd., Tottori-ken (JP)

( * ) Notice: Subject to any disclaimer, the term of this patent is extended or adjusted under 35 U.S.C. 154(b) by 0 days.

(21) Appl. No.: 09/970,734

(22) Filed: Oct. 4, 2001

(65) Prior Publication Data

US 2002/0017956 A1 Feb. 14, 2002

Related U.S. Application Data

(63) Continuation of application No. PCT/JP00/07648, filed on Oct. 30, 2000.

(30) Foreign Application Priority Data

| | | |
|---|---|---|
| Mar. 10, 2000 | (JP) | 2000-067357 |
| Mar. 15, 2000 | (JP) | 2000-071407 |
| Mar. 17, 2000 | (JP) | 2000-076250 |
| Mar. 22, 2000 | (JP) | 2000-080122 |

(51) Int. Cl.[7] .............. H03L 7/087; H03L 7/18
(52) U.S. Cl. .............. 331/1 A; 331/12; 331/16; 331/25; 331/18; 327/156; 327/159
(58) Field of Search .............. 331/1 A, 10–12, 331/18, 16, 25; 327/156–159

(56) References Cited

U.S. PATENT DOCUMENTS

| | | | | | |
|---|---|---|---|---|---|
| 3,571,743 A | * | 3/1971 | Menkes | ...... | 331/11 |
| 4,888,564 A | * | 12/1989 | Ishigaki | ...... | 331/1 A |
| 5,315,269 A | * | 5/1994 | Fujii | ...... | 331/1 A |
| 5,521,948 A | * | 5/1996 | Takeuchi | ...... | 375/376 |
| 5,550,515 A | | 8/1996 | Liang et al. | | |
| 5,796,311 A | * | 8/1998 | Ishii | ...... | 331/11 |
| 6,100,767 A | * | 8/2000 | Sumi | ...... | 331/11 |
| 6,147,561 A | * | 11/2000 | Rhee et al. | ...... | 331/12 |

FOREIGN PATENT DOCUMENTS

| | | |
|---|---|---|
| JP | 63122366 | 5/1988 |
| JP | 01227627 | 9/1989 |
| JP | 05308283 | 11/1993 |
| JP | 09098084 | 4/1997 |
| JP | 10135822 | 5/1998 |
| JP | 10135826 | 5/1998 |
| JP | 10256908 | 9/1998 |
| JP | 11163722 | 6/1999 |
| JP | 2000106524 | 4/2000 |
| JP | 2000232358 | 8/2000 |

* cited by examiner

Primary Examiner—David Mis
(74) Attorney, Agent, or Firm—William E. Pelton, Esq.

(57) ABSTRACT

A PLL circuit produces first to n-th (n being an integer equal to or greater than 2) reference signals. A first variable frequency divider divides the frequency of an output of a voltage-controlled oscillator to produce a first feedback signal. A second variable frequency divider divides the output of the voltage-controlled oscillator to produce second to n-th feedback signals. A phase comparator compares the phases of the first to the n-th reference signals with the phases of the first to the n-th feedback signals to produce first to n-th error signals. A controller produces a control signal from the error signals. The PLL circuit synchronizes the first reference signal with the first feedback signal in phase after the phase difference between at least one of the first to n-th reference signals and a corresponding feedback signal becomes smaller than a predetermined value. The frequency-division ratio of the second variable frequency divider is 1/n that of the first variable frequency divider.

5 Claims, 7 Drawing Sheets

PRECISE PHASE COMPARISON EVEN WITH FRACTIONAL FREQUENCY DIVISION RATIO

FIELD OF THE INVENTION

This application is a continuation of PCT International Application No. PCT/JP00/07648, filed Oct. 30, 2000, designating the United States of America, the contents of which are incorporated by reference into the present invention.

The present invention relates to a PLL circuit.

BACKGROUND ART

A PLL apparatus which generates, from a reference signal having a certain frequency, signals having various frequencies that are in synchronization with this reference signal is known as illustrated in "SANYO TECHNICAL REVIEW" VOL.10, NO.1, page 32, February 1978, for example. This PLL apparatus includes a reference oscillator generating a reference signal RF, a voltage-controlled oscillator generating an output signal OF having a frequency responsive to a control voltage CV, a variable frequency divider dividing the output signal OF to produce a feedback signal FV, a single phase comparator comparing the phase of the feedback signal FV with the phase of the reference signal to produce an error signal ER, and a low-path filter producing the control voltage CV in response to the error signal ER.

This PLL circuit has the disadvantage of having a long lock-up time (the time until synchronization between the output signal and the reference signal is reached), since it has a single-stage phase comparator and therefore, phase comparison is performed only once during one period of the reference signal.

Japanese Unexamined Patent Publication No. 10-135822 discloses a PLL circuit which can get rid of such disadvantage. The PLL circuit disclosed in this publication includes means for generating a plurality of reference signals having different phases, a plurality of (four, for example) frequency dividers for dividing the frequency of the output signal of the voltage-controlled oscillator, and a plurality of phase comparators for comparing the phase of each of the frequency dividers with the phase of a corresponding one of the reference signals in order to perform phase comparisons several times during one period of the reference signals.

However, the PLL circuit disclosed in this publication consumes electric power in large quantity since it has four frequency-dividers. Especially the consumption is large during an early stage when all the four phase comparators are operated for performing phase comparisons four times during one period of the reference signals. Furthermore, since the PLL circuit has the plurality of the phase comparators which require a relatively large layout space, there is a problem that it is difficult to implement the PLL circuit in an LSI.

Besides, the PLL circuit disclosed in the publication has the plurality of the phase comparators for comparing, with the outputs of the plurality of the frequency dividers that individually divide the frequency of the output of the voltage-controlled oscillator, the plurality of the reference signals having the frequency of 2.6 MHz and different phases which are produced by a delay circuit that delays an output of a fixed frequency divider having a frequency-division ratio of 5 for dividing by 5 the frequency of the output signal having the frequency of 13 MHz output from the reference oscillator.

In the PLL circuit of this type, the frequency of the plurality of the reference signals divided by the number of the reference signals has to match a channel spacing frequency, or a spacing in frequency of signals to be produced by the PLL circuit. However, in the PLL circuit disclosed in the publication, the number of the phase comparators in use, that is the number of the reference signals is an exponentiation of 2. For example, when the channel spacing frequency is required to be 200 kHz, if the number of 16 is selected as the exponentiation of 2, (the frequency of the reference signals)/(the number of the reference signals) is equal to 1300 kHz/5/16=162.5 kHz, and does not match the channel spacing frequency of 200 kHz.

When making (the frequency of the reference signals)/(the number of the reference signals) match a required channel spacing frequency is not possible, the frequency-division ratio of the frequency divider that divides the frequency of the output of the voltage-controlled oscillator may have to be of a value including not only an integer but also a fraction. In that case, however, C/N (Carrier to Noise Ratio) will be degraded since it is impossible to perform phase comparisons with high precision.

An object of the present invention is to provide a PLL circuit which has a short lock-up time and a low power consumption, and is easy to implement in an LSI for reducing the cost of manufacturing.

Another object of the present invention is to provide a PLL circuit which has a short lock-up time, and is capable of complying with any channel spacing frequency.

Another object of the present invention is to provide a PLL circuit which can perform phase comparisons with high precision even when its frequency divider has a frequency-division ratio of a value that includes not only an integer but also a fraction by which the output of its voltage-controlled oscillator is divided.

DISCLOSURE OF THE INVENTION

The PLL circuit according to the first embodiment of the invention comprises a PLL frequency synthesizer (13) including a first variable frequency-dividing means (8), and a second frequency-dividing means (9), a plurality of phase comparison signals (ER1 to ER13) being produced from outputs of the first and the second variable frequency-dividing means, at least one of the outputs of these variable frequency-dividing means being locked in phase accurately.

The second variable frequency-dividing means (9) may be formed from a variable frequency divider (10) and/or a counter (11).

The PLL circuit according to the first embodiment may include a producing means (2) for producing a plurality of reference signals (FR1 to FR13) having different phases, a voltage-controlled oscillator (6) and phase comparators (A1 to A13, B1 to B13), the first and the second variable frequency-dividing means (8, 9) dividing the frequency of the output signal of the voltage-controlled oscillator (6) to produce a plurality of feedback signal (FP1 to FP13), the phase comparators comparing the phases of the feedback signals with the phases of the reference signals to output the plurality of the phase comparison signals (ER1 to ER13)

It is possible that all of the phase comparison signals are output at the start, and a specific one of the phase comparison signals is output after near lock.

It is possible to cause the first and the second variable frequency-dividing means (8, 9) to operate at the start, and cause only the first variable frequency-dividing means (8) to continue to operate after near lock.

The PLL circuit according to the second embodiment of the invention comprises a producing means (2) including a reference oscillator (3) for producing a plurality of reference signal (FR1 to FR13) having different phases, a variable frequency-dividing means (8, 9) for dividing the frequency of an output signal of a voltage-controlled oscillator (6) to output a plurality of feedback signals (FP1 to FP13), and phase comparators (A1 to A13) for comparing the phases of the plurality of the reference signals with the phases of the plurality of the feedback signals, the number of the reference signals is set such that a quotient of (an oscillation frequency of the reference oscillator)/(a desired channel spacing frequency) is equal to the number of the reference signals.

A fixed frequency divider (4) may be provided between the reference oscillator (3) and the phase comparators (A1 to A13) so that the number of the reference signals can be set to a value (an integer) equal to the quotient divided by a frequency-division ratio of the fixed frequency divider.

The number of the phase comparators (A1 to A13) may be set to be equal to the above-described quotient or the above-described value.

By selecting one reference signal from among the plurality of the reference signals (FR1 to FR13) in succession, selecting one feedback signal from among the plurality of the feedback signals (FP1 to FP13) in succession, and comparing the phases of the selected signals, it is possible form the phase comparators as a single phase comparator.

The PLL circuit according to the third embodiment of the invention comprises a producing means (32) for producing a plurality of reference signals (FR1 to FR13) having different phases, a variable frequency-divider (59) for dividing the frequency of an output of a voltage-controlled oscillator (50) to produce feedback signals (FP1 to FP13), and phase comparators (37, 38) for comparing phases of the feedback signals with phases of the reference signals respectively to produce n (n being an integer equal to or larger than 2) phase comparison signals (U1 to U13, D1 to D13), the variable frequency-divider being supplied with frequency-division data according to n.

The variable frequency divider (59) may be constituted by a first variable frequency divider (51) and a second variable frequency divider (55), a PLL frequency synthesizer (45) including the first frequency divider may be provided, the first variable frequency divider may be supplied with frequency-division data N, and the second variable frequency divider may be supplied with frequency-division data N/n.

By outputting the plurality of the feedback signals (FP2 to FP13) from the second variable frequency divider (55) one by one in succession, outputting the plurality of the reference signals (FR2 to FR13) one by one in succession, and comparing the phases of the output signals, it is possible to deliver the plurality of the phase comparison signals (U2 to U13, D2 toD13).

The first variable frequency divider (51) and/or the second variable frequency divider (55) may be comprised of a pulse swallow counter (53, 57).

The PLL circuit according to the fourth embodiment of the invention comprises a producing means (62) for producing reference signals (FR1 to FR5), a variable frequency divider (71, 72) for dividing the frequency of an output of a voltage-controlled oscillator (70) by a frequency-division ratio of N+B/C (where N, B and C are integers, and B≦C) to output feedback signals (FP1 to FP5), and phase comparators (65, 67) for comparing phases of the reference signals with the phases of the feedback signals, phase comparisons being performed accurately one time out of C.

The variant of the fourth embodiment comprises a producing means (62) for producing a plurality of reference signals (FR1 to FR5) having different phases, a variable frequency divider (71, 72) for dividing the frequency of an output of a voltage-controlled oscillator (70) by a frequency-division ratio of N+B/C (where N, B and C are integers and B≦C) to output a plurality of feedback signals (FP1 to FP5), phase comparators (65, 67) for comparing phases of the reference signals with phases of the feedback signals to output a plurality of phase comparison signals (U1 to U5, D1 to D5), phase comparisons being performed accurately one time out of C.

All the phase comparison signals (U1 to U5, D1 to D5) may be output at the start, and only the phase comparison signal (U1, D1) resulting from the accurate phase comparison may be output after near lock or after lock-up.

The frequency of the reference signal (FR1 to FR5) may be the same as the channel spacing frequency multiplied by C.

BEST MODES OF PRACTICING THE INVENTION

Figure 1:
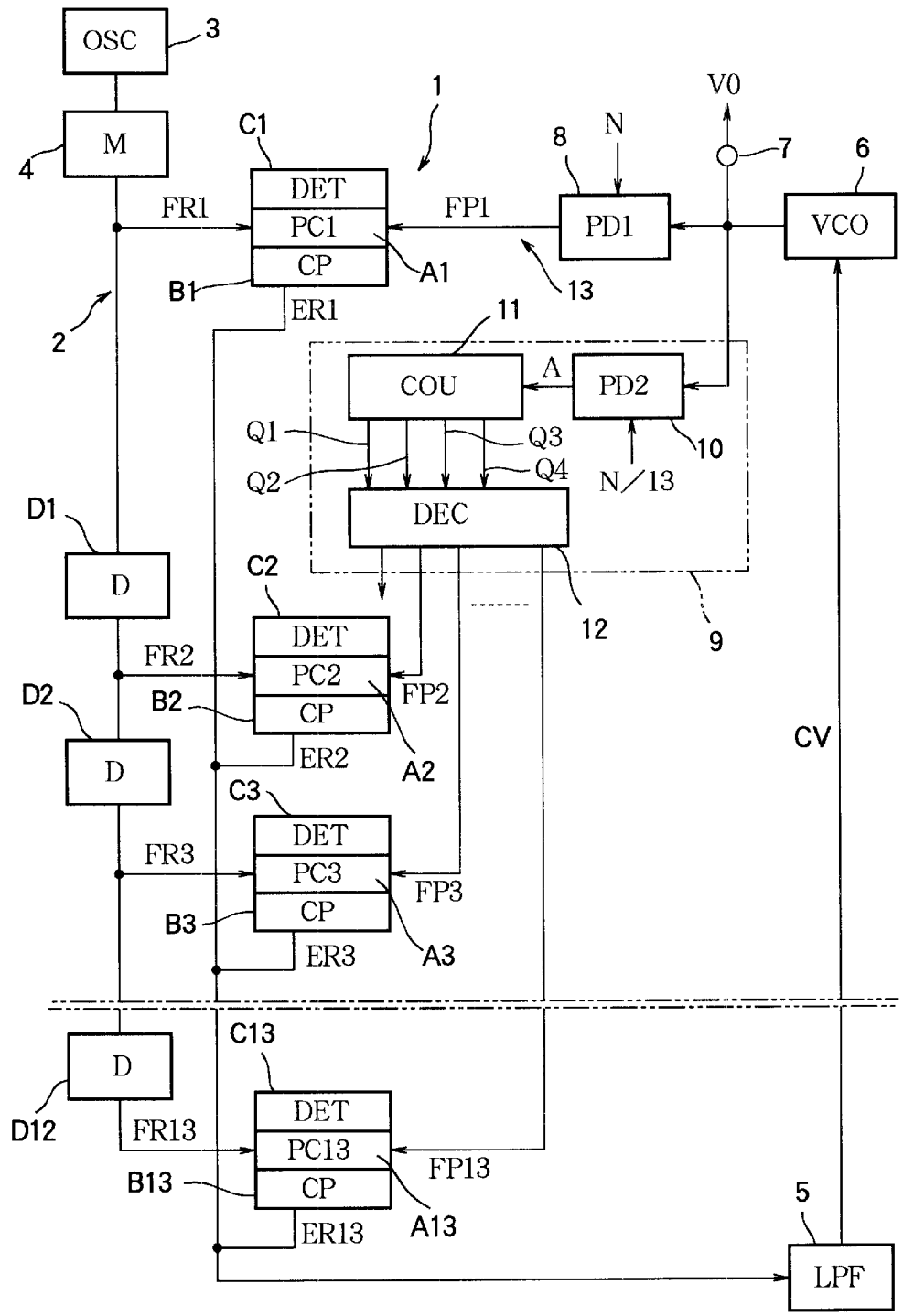
FIG. 1 is a block diagram of a PLL circuit according to a first embodiment of the invention.
Figure 2:
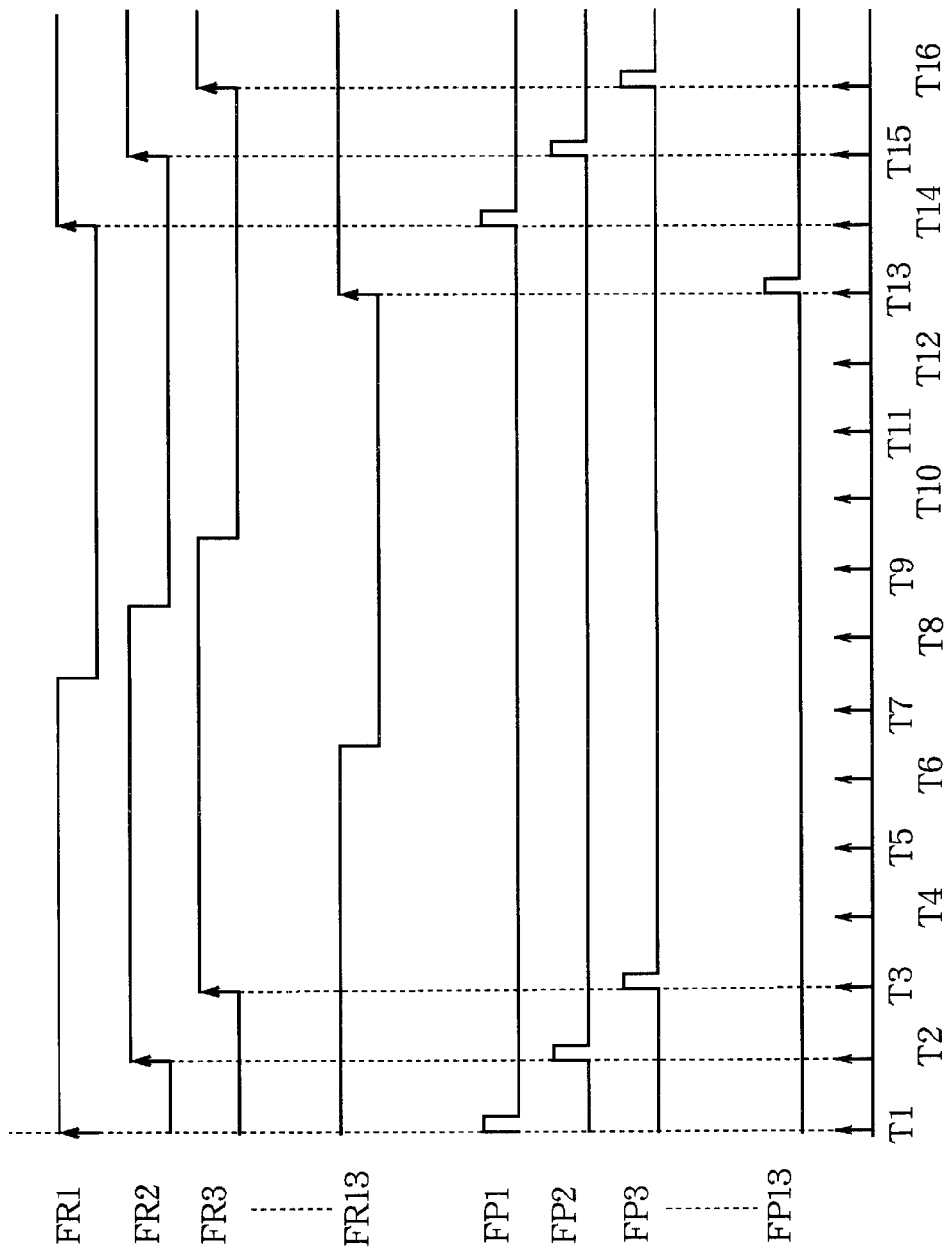
FIG. 2 is a timing diagram of reference signals and feedback signals that appear in the PLL circuit of FIG. 1.

A PLL circuit 1 according to the first embodiment of the invention will now be explained with reference to FIGS. 1 and 2. FIG. 1 is a block diagram of the PLL circuit 1, and FIG. 2 is a timing diagram of reference signals and feedback signals that appear in the PLL circuit 1. As shown in FIG. 1, a reference signal producing means 2 is comprised of a reference oscillator 3, a fixed frequency divider 4, and 12 series-connected delay circuits D1, D2, . . . , D12. The fixed frequency divider 4 that has a frequency-division ratio of 5 to divide an output of the reference oscillator by 5 for example is connected between the reference oscillator 3 and the delay circuit D1.

A reference signal FR1 which is an output of the fixed frequency divider 4 has a reference frequency of 13 MHz/5=2.6 MHz and is input to a phase comparator A1. As shown in FIG. 2, the reference signal FR1 rises at the time T1 and the time T14. The delay circuit D1 delays the reference signal FR1 by 1/13 the period (about $3.85 \times 10^{-7}$ seconds) of the reference signal FR1, and supplies it to a phase comparator A2 as a reference signal FR2. The delay circuit D2 delays the reference signal FR1 by 2/13 the period, and supplies it to a phase comparator A3 as a reference signal FR3.

Likewise, the delay circuit Dn delays the reference signal FR1 by n/13 the period (n being an integer from 3 to 12), and supplies it to a phase comparator A(n+1) as a reference signal FR(n+1).

As described above, the reference signal producing means 2 has the reference oscillator 3 and the delay circuits D1 to D12 to produce the plurality of the reference signals FR1 to FR13 having different phases. The reference signals FR1 to FR13 rise at the times T1 to T13 that are offset in steps of $2.96 \times 10^{-8}$ seconds (see FIG. 2).

Feedback signals FP1, FP2, FP3, ..., FP13 which will be described after are respectively supplied to the other input of each of the phase comparators A1, A2, A3, ..., A13.

The phase comparator A1 compares the phase of the feedback signal FP1 with the phase of the reference signal FR1, and outputs a phase comparison result signal (a pump-up signal or a pump-down signal) to a charge pump B1. The charge pump B1 outputs an error signal ER1 to a low-pass filter 5 in response to the phase comparison result signal.

Likewise, the phase comparator An (n being an integer form 2 to 13) compares the phase of the feedback signal FPn with the phase of the reference signal FRn, and outputs a phase comparison result signal to a charge pump Bn. The charge pump Bn outputs an error signal ERn to the low-pass filter 5 in response to the phase comparison signal.

As described above, the phase comparators A1 to A13 compare the phases of the feedback signals FP1 to FP13 with the phases of the reference signals FR1 to FR13, and output the plurality of the comparison result signals (13 pump-up signals or 13 pump-down signals).

The low-pass filter 5 outputs a control voltage CV to the voltage-controlled oscillator 6 in response to the error signals ER1 to ER13. The voltage-controlled oscillator 6 outputs an output signal VO through an output terminal 7 in response to the control voltage CV.

A first variable frequency-dividing means 8 has an input connected to the output of the voltage-controlled oscillator 6 and an output connected to the input of the phase comparator A1. A not illustrated control unit comprised of a microcomputer sets a frequency-division ratio N to the first variable frequency-dividing means 8. The first variable frequency-dividing means 8 divides the frequency of the output signal VO output from the voltage-controlled oscillator 6 by N, and outputs it to the phase comparator A1 as the feedback signal FP1. As described above, the PLL circuit 1 has at least one variable frequency-dividing means (the first variable frequency-dividing means 8 in this embodiment) and at least one phase comparator (the phase comparator A1 in this embodiment), the variable frequency-dividing means outputting the feedback signal FP1 to the phase comparator. The reference oscillator 3, the fixed frequency divider 4, the phase comparator A1, the first variable frequency-dividing means 8, the low-pass filter 5, the voltage-controlled oscillator 6, etc. constitute a PLL frequency synthesizer 13.

Furthermore, the PLL circuit 1 has a second variable frequency-dividing means 9 comprised of a variable frequency divider 10, a counter 11, and a decoder 12. The variable frequency divider 10 has an input connected to the output of the voltage-controlled oscillator 6, and an output connected to an input of the counter 11. The control unit sets a frequency-division ratio N/13 to the variable frequency divider 10. The second variable frequency-dividing means 9 can be formed from the variable frequency divider 10 or the counter 11.

The variable frequency divider 10 divides the frequency of the output signal VO of the voltage-controlled oscillator 6 by N/13 in accordance with the set frequency-division ratio N/13, and outputs it to the counter 11 as an intermediate signal A.

As the counter 11, a counter having about the same structure as the 4-bit counter 44a disclosed in a Japanese Patent Application No. 11-201752 filed by the same applicant as the present application may be used. However, detailed explanation will be omitted since it has not direct connection with the present invention. In brief, the counter 11 is comprised of cascaded toggle flip-flops. The toggle flip-flops output signals Q1, Q2, Q3, and Q4 respectively. The signal Q1 is the intermediate signal A with its frequency divided by 2, the signal Q2 is the intermediate signal A with its frequency divided by 4, the signal Q3 is the intermediate signal A with its frequency divided by 8, and the signal Q4 is the intermediate signal A with its frequency divided by 16. In this manner, the counter 11 outputs the signals Q1, Q2, Q3, and Q4 to the decoder 12.

The decoder 12 has an input connected to the output of the counter 11. As the decoder 12, a circuit having about the same structure as the distributing circuit 32 disclosed in the Japanese Patent Application No. 11-201752 filed by the same applicant as the present application may be used. However, detailed explanation will be omitted since it has not direct connection with the present invention.

In brief, the decoder 12 is comprised of 4 conductors and 13 AND gates. The 4 conductors are connected to the signals Q1, Q2, Q3, and Q4 respectively. The 4 conductors are connected to a first, a second, a third and a fourth input terminals of each of the AND gates respectively.

The first to fourth input terminals of each of the AND gates are provided with an input-inverting capability (an inverter) as necessary. The feedback signals FP2 to FP13 are output from the output terminals of the AND gates respectively.

Although the PLL circuit 1 according to the first embodiment has the plurality of the phase comparators A1 to A13, the present invention is not restricted thereto. That is, it is possible that the plurality of the phase comparison signals are output from a single phase comparator.

A detector C1, which is a circuit for detecting synchronization between the feedback signal FP1 and the reference signal FR1, is comprised of an AND gate outputting an AND of the pump-up signal and the pump-down signal from the phase comparator A1, and an integrator circuit comprised of a resistor and a capacitor for integrating the output of the AND gate. An output of the integrator circuit is output to the not illustrated control unit as a synchronization detection signal. Detectors C2 to C13 having the same structure as the detector C1 are connected to the phase comparators A2 to A13 respectively.

As described above, the PLL circuit 1 includes the PLL frequency synthesizer 13 having the first variable frequency-dividing means 8 and having the second variable frequency-dividing means 9. Both of the first variable frequency-dividing means 8 and the second variable frequency-dividing means 9 run at least at the start of the lock-up process to perform phase comparison several times during one period of the reference signal.

The first variable frequency-dividing means 8 and the second variable frequency-dividing means 9 divide the frequency of the output signal VO of the voltage-controlled oscillator 6 respectively, and output the feedback signals FP1 to FP13. The phase comparators A1 to A13 compare the phases of the feedback signals FP1 to FP13 with the phases of the reference signals FR1 to FR13 respectively, and output a plurality of phase comparison result signals.

The operation of the PLL circuit 1 will be explained below with reference to FIGS. 1 and 2. Suppose that a user selects a frequency of 2.08 GHz by an input means (not illustrated), and presses a not illustrated start key.

The not illustrated control unit starts control operation, and since (the frequency of the reference signals)/(the number of the reference signals)=2.6 MHz/13=200 kHz, calculates the frequency-division ratio N to be set in the first variable frequency-dividing means 8 by N=2080×10³ kHz/200 kHz=10400.

Then, the control unit sets the frequency-division ratio of the variable frequency divider 10 to N/13=800. The first variable frequency-dividing means 8 divides the frequency of the output signal VO by 10400 in accordance with the set frequency-division ratio of 10400, and outputs the feedback signal FP1 to the phase comparator A1.

The variable frequency divider 10 divides the frequency of the output signal VO by 800 in accordance with the set frequency-division ratio of 800, and outputs the intermediate signal A. The counter 11 outputs the signals Q1, Q2, Q3, and Q4 upon reception of the intermediate signal A. The decoder 12 outputs the feedback signals FP2 to FP13 to the phase comparators A2 to A13 upon reception of the signals Q1, Q2, Q3, and Q4. As described above, the feedback signals FP2 to FP13 have waveforms lagging behind the feedback signal FP1 by 1/13 the period, 2/13 the period, ..., 12/13 the period respectively.

In other words, as shown in FIG. 2, the rise times of the feedback signals FP1 to FP13 match the rise times T1 to T13 of the reference signals FR1 to FR13 respectively.

The phase comparators A1 to A13 compare the phases of the feedback signals FP1 to FP13 with the phases of the reference signals FR1 to FR13 at the times T1 to T13 respectively.

Accordingly, at the start of the lock-up process, all of the first variable frequency-dividing means 8, the second variable frequency-dividing means 9 and the phase comparators A1 to A13 operate so that phase comparisons are performed by the 13-stage phase comparators, thereby outputting all the phase comparison result signals (13 pump-up signals or pump-down signals).

Thus, phase comparisons are performed 13 times during one period of the reference signal FR1, providing a shortened lock-up time (the time until the output signal VO reaches about the set frequency) which is 1/13 that of the conventional type with only a single-stage phase comparator.

Through repetition of the phase comparisons, the frequency of the output signal VO approaches the set frequency gradually. When the detectors C1 to C13 detect their input signals to have reached 80% to 95% of the frequency after lock-up where the frequency of the output signal VO has become nearly equal to the set frequency (referred to as "near lock" hereinafter), they output signals indicative of that state to the control unit.

The control unit stops the second variable frequency-dividing means 9 and the phase comparators A2 to A13 in response to the signal indicative of the near lock, while allowing the first variable frequency-dividing means 8 and the phase comparator A1 to continue to operate. Thus, the first variable frequency-dividing means 8 and the phase comparator A1 alone continue to operate to output a specific one of the phase comparison result signals (the signal output from the phase comparator A1 in this embodiment) after detection of near lock.

As described above, the phase comparator A1 compares the phase of the reference signal FR1 with the phase of the feedback signal FP1 from the first variable frequency-dividing means 8, and outputs the phase comparison result signal to the charge pump B1. The charge pump B1 outputs the error signal ER1 to the low-pass filter 5. The low-pass filter 5 outputs the control voltage CV to the voltage-controlled oscillator 6.

Through repetition of the above-described loop interaction, the PLL circuit 1 reaches the lock-up state and delivers stably the output signal VO having the set frequency of 2.08 GHz through the output terminal 7.

As described above, in the PLL circuit according to the first embodiment 1, after detection of near lock, only the first variable frequency-dividing means 8 outputting the precise feedback signal FP1 by performing frequency-division with the frequency-division ratio N (an integer) is caused to continue to operate so that the phase comparator A1 constituting the PLL frequency synthesizer 13 performs phase comparisons to output phase comparison result signals.

In consequence, the output of at least one variable frequency-dividing means (the first variable frequency-dividing means 8 in this embodiment), that is, the feedback signal FP1 is locked up accurately. In other words, the phase of the feedback signal FP1 and the phase of the reference signal FR1 are in perfect agreement. Thus, the frequency of the output signal VO matches the set frequency precisely.

Another feature of the PLL circuit 1 having the above-described structure will be described below. As already described, the reference oscillator 3 outputs the oscillation frequency of 13 MHz, and the fixed frequency divider 4 with the frequency-division ratio of 5 divides the oscillation frequency by 5 to produce the reference signal of 2.6 MHz. hen the channel spacing frequency is required to be 200 kHz, (the frequency of the reference signals)/(the number of the reference signals) is set to 200 kHz as well. Accordingly, the number of the reference signals (FR1 to FR13) is set to a quotient of (the oscillation frequency of the reference oscillator 3 which is 13 MHz)/(200 kHz), which equals to 65 in this embodiment, divided by the frequency-division ratio of the fixed frequency divider 4 which is 5, that is, it is set to the integer of 13.

By setting the number of the reference signals FR1 to FR13 to the integer of 13, it is possible to adapt to any channel spacing frequency (200 kHz in this embodiment). Concurrently, the number of the phase comparators A1 to A13 is set to 13 as well.

In the above-described structure, the fixed frequency divider 4 may be omitted. In that case, the number of the reference signals FR is set to the quotient of (the oscillation frequency of the reference oscillator 3 which is 13 MHz)/(the channel spacing frequency which is 200 kHz), or the integer of 65. The number of the phase comparators A is set to the quotient of 65 as well in that case.

Figure 3:
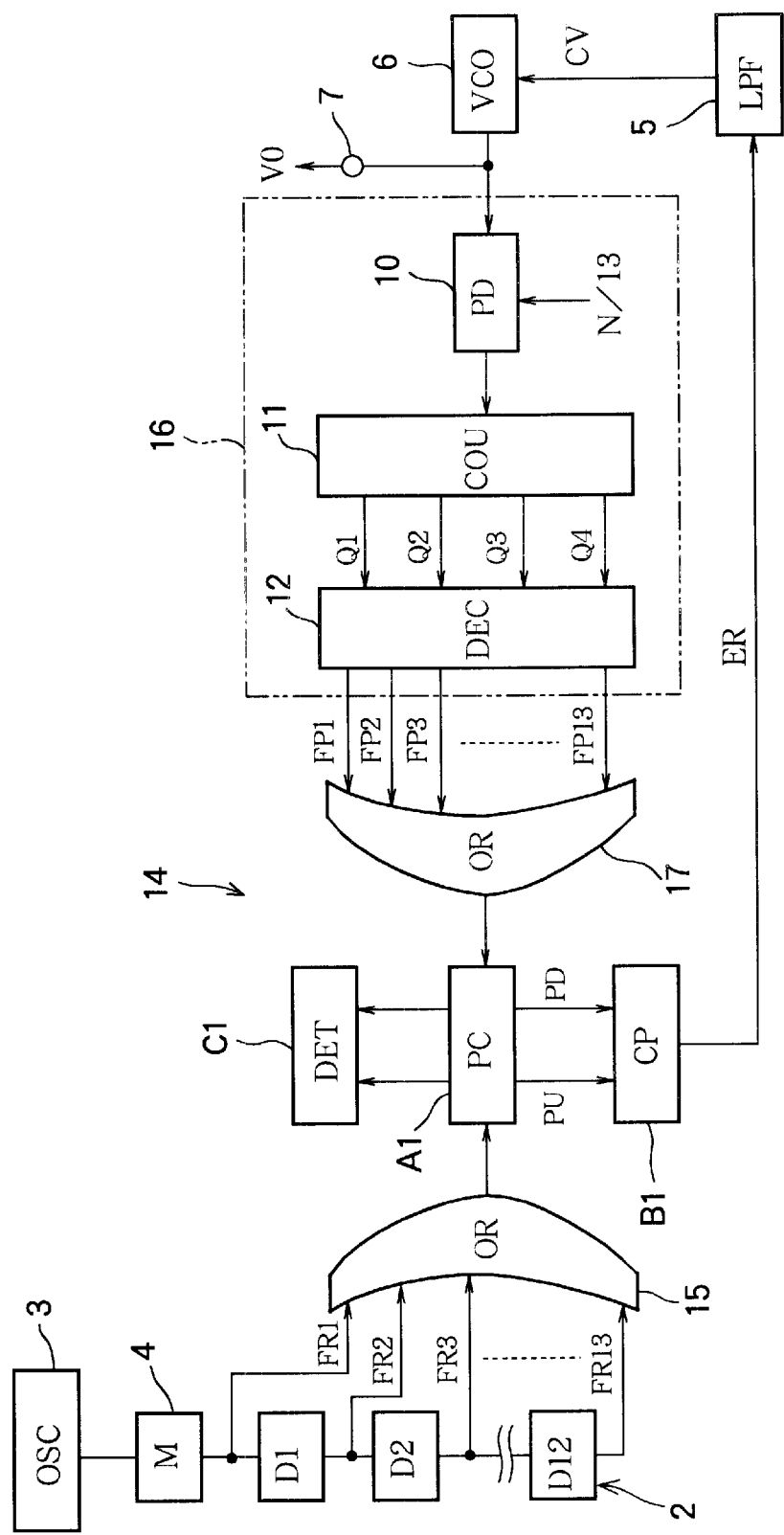
FIG. 3 is a block diagram of a PLL circuit according to a second embodiment of the invention.

A PLL circuit 14 according to a second embodiment of the invention will now be described with reference to a block diagram shown in FIG. 3. In FIG. 3, the same reference characters represent the same parts shown in FIG. 1.

A reference signal producing means 2 comprised of a reference oscillator 3, a fixed frequency-dividing means 4, delay circuits D1 to D12, etc. outputs a plurality of reference signals FR1 to FR13 having different phases to a first selection means 15 comprised of OR gates for example.

A variable frequency-dividing means 16 is comprised of a programmable frequency divider 10, a counter 11, a decoder 12, etc. This variable frequency-dividing means 16 divides the frequency of an output signal VO of a voltage-controlled oscillator 6 by a frequency-division ratio N/13 like the second variable frequency-dividing means 9 of the first embodiment, and outputs a plurality of feedback signals FP1 to FP13 having different phases to a second selection means 17 comprised of OR gates.

One input of a phase comparator A1 is connected to the output of the first selection means 15, and the other input of the phase comparator A1 is connected to the output of the second selection means 17. A detector C1 is a circuit for detecting the lock-up state on the basis of a phase comparison result signal from the phase comparator A1.

The charge pump B1 outputs an error signal ER to a low-pass filter 5 on the basis of the phase comparison result signal PU or PD input from the phase comparator A1. The low-pass filter 5 outputs a control voltage CV according to the error signal ER to the voltage-controlled oscillator 6.

The operation of the PLL circuit 14 will be described below with reference to FIG. 3. First, suppose that 2.08 GHz is set as a set frequency into a not illustrated control unit through a not illustrated input means. The control unit calculates a frequency-division ratio by $N/13=2080\times10^3/200/13=800$ to be set into the variable frequency-dividing means 16.

The variable frequency-dividing means 16 divides the frequency of the output signal VO from the voltage-controlled oscillator 6 by 800 in accordance with the set frequency-division ratio of 800, and supplies the feedback signals FP1 to FP13 having different phases to the second selection means 17 at times T1 to T3 respectively.

The second selection means 17 selects from among the feedback signals FP1 to FP3, and supplies it to the other input of the phase comparator A1.

The reference oscillator 3 oscillates at 13 MHz for example, and the reference signal FR1 output from the fixed frequency divider 4 has a frequency of 13 MHz/5=2.6 MHz. The reference signal producing means 2 delays the reference signal FR1 by the delay circuits D1 to D12 connected in series to output the reference signals FR1 to FR13 having different phases at the times T1 to T13 to the first selection means 15 respectively (see FIG. 1).

The first selection means 15 selects from among the reference signals FR1 to FR3, and supplies it to the one input of the phase comparator A1.

The phase comparator A1 compares the phase of the selected one of the feedback signals FP1, FP2, . . . , FP13 with the phase of the selected one of the reference signals FR1, FR2, . . . , FR13 at the times T1 to T13 respectively, and outputs phase comparison result signals PU or PD to the charge pump B1. The first embodiment uses the plurality of the phase comparators, while the second embodiment uses only one phase comparator (the phase comparator A1) by the provision of the first selection means 15 and the second selection means 17.

The charge pump B1 outputs the error signals ER to the low-pass filter 5 in response to the phase comparison result signals PU or PD. The low-pass filter 5 outputs the control voltage CV to the voltage-controlled oscillator 6 in response to the error signals ER. The voltage-controlled oscillator 6 delivers the output signal VO in response to the control voltage CV through the output terminal 7.

Through repetition of the above-described loop interaction, the PLL circuit 14 reaches the lock-up state and delivers stably the output signal VO having the set frequency of 2.08 GHz through the output terminal 7.

Figure 4:
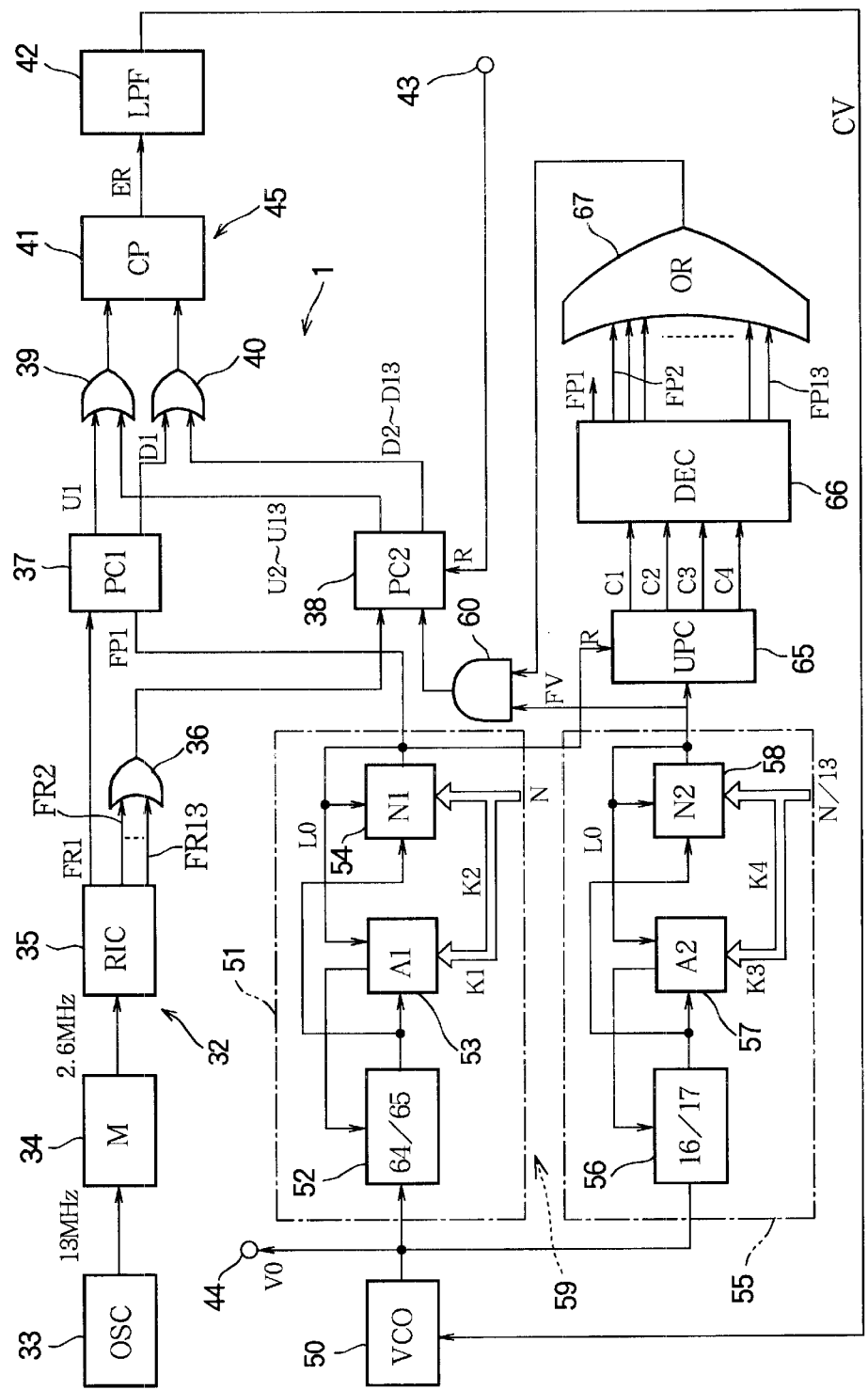
FIG. 4 is a block diagram of a PLL circuit according to a third embodiment of the invention.

A PLL circuit 31 according to a third embodiment of the invention will now be described with reference to FIGS. 4 and 5. FIG. 4 is a block diagram of the PLL circuit according to the third embodiment, and FIG. 5 is a timing diagram of various signals that appear in the PLL circuit 31.

In FIG. 4, a reference signal producing means 32 is comprised of a reference oscillator 33, a fixed frequency divider 34, a ring counter 35, etc. The fixed frequency divider 34, which divides the frequency of an output of the reference oscillator 33 by a frequency-division ratio of 5 for example, is connected between the reference oscillator 33 and the ring counter 35. The fixed frequency divider 34 outputs a signal of 2.6 MHz for example, which is obtained by dividing the signal of 13 MHz output from the reference oscillator 33 by 5, to the ring counter 35.

The ring counter 35, which is comprised of 13 flip-flops (not shown) connected in cascade for example, outputs 13 reference signals FR1 to FR13 having different phases in response to the signal of 2.6 MHz input thereto.

Figure 5:
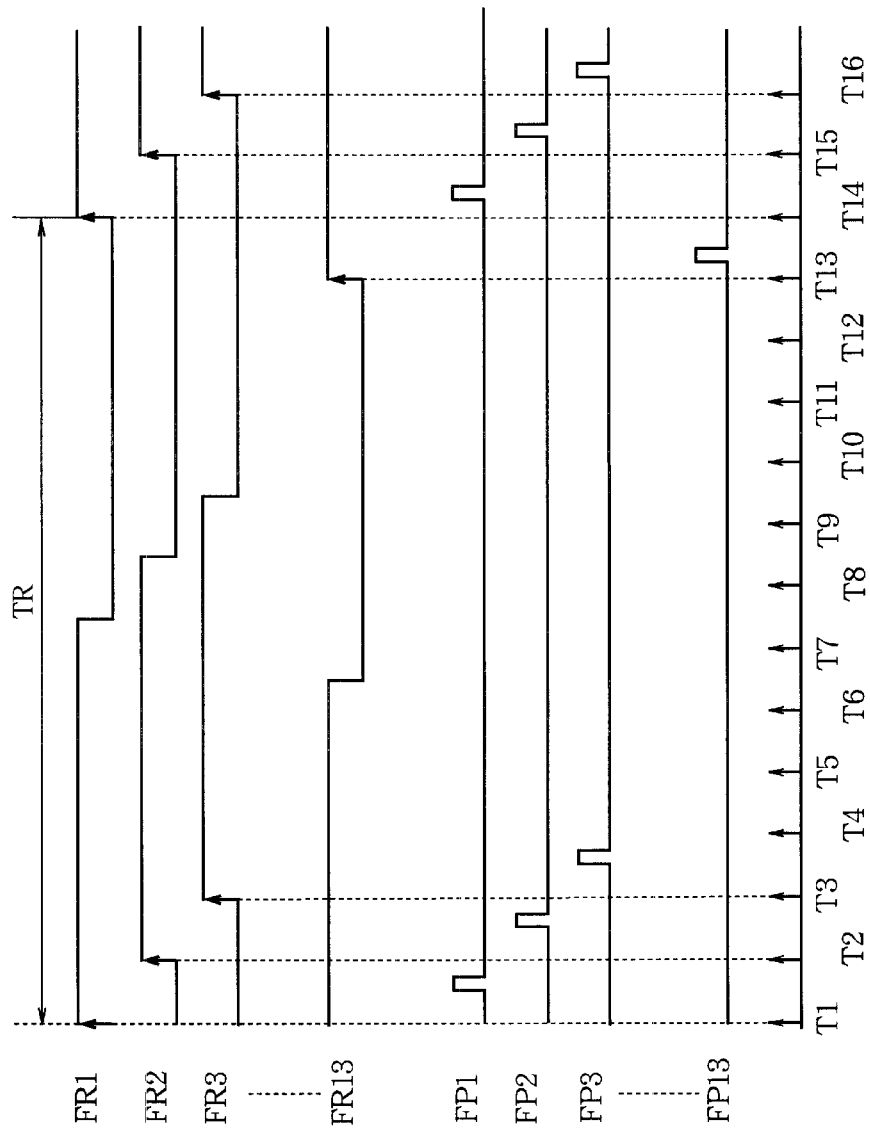
FIG. 5 is a timing diagram of reference signals and feedback signals that appear in the PLL circuit of FIG. 4.

As shown in FIG. 5, the reference signal FR2 lags behind the reference signal FR1 by 1/13 the period of the reference signal FR1. Likewise, the reference signal FRA (A being an integer from 2 to 13) lags behind the reference signal FR1 by A/13 the period. Since (the frequency of the reference signals)/(the number of the reference signals) equals to 2.6 MHz/13=200 kHz, it matches a desired channel space (channel spacing frequency).

The reference signal FR1 is input to one input of a first phase comparator 37. The reference signals FR2 to FR13 are input to an OR gate 36, and an output signal of the OR gate 36 is supplied to one input of a second phase comparator 38.

A first variable frequency divider 51 is comprised of a 2-factor pre-scaler 52, a swallow counter 53, and a coarse counter 54. The 2-factor pre-scaler 52 is for performing frequency-division by either a frequency-division ratio of 64 or a frequency-division ratio of 65. A first coincidence circuit (not shown) is connected to the swallow counter 53, and a second coincidence circuit (not shown) is connected to the coarse counter 54. A load signal LO output form the first variable frequency divider 51 is supplied to the swallow counter 53 and the coarse counter 54.

Suppose that a user selects 2.08 GHz by a frequency setting key (not shown). A not illustrated control unit comprised of a microcomputer to which the frequency setting key is connected calculates a frequency-division ratio N of the first variable frequency divider 51 and supplies it to the first variable frequency divider 51. Here, since the channel spacing frequency is 200 kHz, $N=2080\times10^3$ KHz/200 kHz= 10400.

The control unit calculates and sets the number of operations K1 of the swallow counter 53 and the number of operations K2 of the coarse counter 54. In this case, K1=32 and K2=162. As a result, the frequency-division ratio of the first variable frequency divider 51 is $162\times64+32=10400$. As described above, the first variable frequency divider 51 is configured to have a desired frequency-division ratio by switching between two different frequency-division ratios by use of the pulse swallow counter. In consequence, time delay in signal propagation can be reduced to improve the operation speed.

In this manner, the frequency of the output signal VO from a voltage-controlled oscillator 50 is divided by N, and supplied to the other input of the first phase comparator 37 as a feedback signal FP1. The first phase comparator 37 compares the phase of the reference signal FR1 with the phase of the feedback signal FP1, and outputs a pump-up signal U1 to an OR gate 39, or outputs a pump-down signal D1 to an OR gate 40 as a phase comparison result signal.

The OR gates 39 and 40 output the pump-up signal U1 and the pump-down signal D1 to a charge pump 41. The charge pump 41 produces an error signal ER on the basis of these signals U1 and D1, and outputs it to a low-pass filter 42.

The low-pass filter 42 produces a control voltage CV by cutting high frequency components of the error signal, and outputs it to the voltage-controlled oscillator 50. The reference signal producing means 32, the first phase comparator 37, the OR gates 39 and 40, the charge pump 41, the low-pass filter 42, the voltage-controlled oscillator 50, the first variable frequency divider 51, etc. constitute a PLL frequency synthesizer 45.

A second variable frequency divider 55 is comprised of a 2-factor pre-scaler 56, a swallow counter 57, and a coarse counter 58. The 2-factor pre-scaler 56 is for performing phase comparisons by either a frequency-division ratio of 16 or a frequency-division ratio of 17. A first coincidence circuit (not shown) is connected to the swallow counter 57, and a second coincidence circuit (not shown) is connected to the coarse counter 58. A load signal LO output form the second variable frequency divider 55 is supplied to the swallow counter 57 and the coarse counter 58.

As described above, the first variable frequency divider 51 is given N as a frequency-division ratio. On the other hand, when the number of the reference signals is n, the second variable frequency divider 55 is given N/n as a frequency-division ratio.

For example, if n=13, the control unit gives N/n=10400/13=800 to the second variable frequency divider 55. The control unit calculates the number of operations K3 of the swallow counter 57 and the number of operations K4 of the coarse counter 58, and sets them into these counters. In this case, K3=16 and K4=49. As a result, the frequency-division ratio of the second variable frequency divider 55 is 49×16+16=800.

In this manner, an intermediate signal FV obtained by dividing the frequency of the output signal VO from the voltage-controlled oscillator 50 by N/13 is supplied to an AND gate 60 and an UP counter 65. The first variable frequency divider 51, the second variable frequency divider 55, etc. constitute a variable frequency-dividing means 59.

As the UP counter 65, a counter having about the same structure as the 4-bit counter 44a disclosed in the Japanese Patent Application No. 11-201752 filed by the same applicant as the present application may be used. However, detailed explanation will be omitted since it has not direct connection with the present invention. In brief, the UP counter 65 is comprised of cascaded toggle flip-flops. The toggle flip-flops output signals C1, C2, C3, and C4 respectively.

The signal C1 is the intermediate signal FV with its frequency divided by 2, the signal C2 is the intermediate signal FV with its frequency divided by 4, the signal C3 is the intermediate signal FV with its frequency divided by 8, and the signal C4 is the intermediate signal FV with its frequency divided by 16. In this manner, the UP counter 65 outputs the signals C1, C2, C3, and C4 to a decoder 66.

The decoder 66 has an input connected to the output of the UP counter 65. As the decoder 66, a circuit having about the same structure as the distributing circuit 32 disclosed in the Japanese Patent Application No. 11-201752 filed by the same applicant as the present application may be used. However, detailed explanation will be omitted since it has not direct connection with the present invention.

In brief, the decoder 66 is comprised of 4 conductors and 13 AND gates. The four conductors are connected to the signals C1, C2, C3, and C4 respectively. The four conductors are respectively connected to a first, a second, a third and a fourth input terminals of each of the AND gates.

The first to fourth input terminals of each of the AND gates are provided with an input-inverting capability (an inverter) as necessary. The AND gates output feedback signals FP2 to FP13 respectively (the feedback signal FP1 is not used)

The feedback signals FP2 to FP13 are input to an OR gate 67. The OR gate 67 outputs the feedback signals FP2 to FP13 that are produced by the second variable frequency divider 55, the UP counter 65 and the decoder 66 to the AND gate 60 in succession one by one. The AND gate 60 receives the intermediate signal FV and the feedback signals FP2 to FP13, and its output signal is supplied to the other input of the second phase comparator 38.

As described above, the reference signals FR2 to FR13 are supplied to the one input of the second phase comparator 38 in succession by way of the OR gate 36, and the feedback signals FP2 to FP13 are supplied to the other input in succession by way of the AND gate 60.

The second phase comparator 38 compares the phases of the reference signals FR2 to FR13 with the phases of the feedback signals FP2 to FP13 respectively, and outputs pump-up signals U2 to U13 to the OR gate 39, or outputs pump-down signals D2 to D13 to the OR gate 40 as phase comparison result signals.

The OR gate 39 outputs the plurality of the phase comparison result signals (pump-up signals) U1 to U13 to the charge pump 41 in succession. Likewise, the OR gate 40 outputs the plurality of the phase comparison result signals (pump-down signals) D1 to D13 to the charge pump 41 in succession. The feedback signal FP1 output from the first variable frequency divider 51 is supplied to the UP counter 65 as a reset signal R. Although the PLL circuit according to the third embodiment has two phase comparators (37, 38), it can be configured such that the plurality of the phase comparison result signals are output from a single phase comparator.

A first and a second detectors for detecting synchronization between the feedback signals and the reference signals are connected to the first phase comparator 37 ands the second phase comparator 38 respectively, though they are not shown in the drawings. Since these detectors have the same structure as the detectors C1 to C13 of the first embodiment 1, explanation of them will be omitted. A switching terminal 43 is connected between an output terminal of the not illustrated control unit and a reset terminal of the second phase comparator 38. An output terminal 44 of the PLL circuit is connected to the output of the voltage-controlled oscillator 50.

Next, the operation of the PLL circuit 31 according to the third embodiment will be explained below with reference to FIGS. 4 and 5. Suppose that a user selects 2.08 GHz by a not illustrated frequency setting key, and presses a start key. The not illustrated control unit sets a frequency-division ratio of N=10400 into the first variable frequency divider 51. Concurrently, the control unit sets a frequency-division ratio calculated on the basis of the number of the reference signals (N/n=10400/13=800 in this embodiment) into the second variable frequency divider 55.

A signal of 13 MHz output form the reference oscillator 33 is divided by the fixed frequency divider 34 to produce the reference signal of 2.6 MHz so that the ring counter 35 outputs the plurality of the reference signals FR1 to FR13 having different phases. The reference signals FR1 to FR13 rise at the times T1 to T14 respectively (see FIG. 5).

The first variable frequency divider 51 divides the frequency of the output signal VO from the voltage-controlled oscillator 50 by 10400 in accordance with the frequency-division ratio of N=10400 to produce the feedback signal FP1. The feedback signal FP1 (see FIG. 5) is supplied to the first phase comparator 38.

The second variable frequency divider 55 divides the frequency of the output signal VO from the voltage-controlled oscillator 50 by 800 in accordance with the frequency-division ratio of N/n=800 to produce the intermediate signal FV. The UP counter 65 outputs the signals C1, C2, C3, and C4 in response to the intermediate signal FV. The decoder 66 outputs the feedback signals FP2 to FP13 to the OR gate 67 in response to the signals C1, C2, C3, and C4.

The AND gate 60 produces ANDs of the intermediate signal FV and the feedback signals FP2 to FP13. The AND gate 60 outputs the feedback signals FP2 to FP13 to the second phase comparator 38 in succession. When the phases of the feedback signals lag behind the phases of the reference signals, the feedback signals FP1 to FP13 rise slightly behind the rises (T1 to T13) of the reference signals FR1 to FR13 (see FIG. 5).

The first phase comparator 38 compares the phase of the reference signal FR1 with the phase of the feedback signal FP1, and outputs the phase comparison result signal U1 or D1 to the charge pump 41 by way of the OR gates 39 and 40. The charge pump 41 outputs the error signal ER1 to the low-pass filter 42 according to the phase comparison result signal U1 or D1. The low-pass filter 42 outputs the control voltage CV1 to the voltage-controlled oscillator 50 in response to the error signal ER1, and accordingly, the phase and the frequency of the output signal VO approach the phase and the frequency of the reference signal FR1.

Then, the second phase comparator 38 compares the phases of the reference signals FR2 to FR13 with the phases of the feedback signals FP2 to FP13, and outputs the phase comparison result signals U2 to U13 or D2 to D13 to the charge pump 41 by way of the OR gates 39 and 40.

The charge pump 41 outputs the error signals ER2 to ER13 to the low-pass filter 42 in response to the phase comparison result signals. The low-pass filter 42 outputs the control voltages CV2 to CV13 to the voltage-controlled oscillator V50 in response the error signals ER2 to ER13. In consequence, the phase and the frequency of the output signal VO output from the voltage-controlled oscillator 50 approach the phase and the frequency of the reference signals FR2 to FR13. Such a phase comparison process is repeated.

With this structure, phase comparisons are performed 13 times during one period of the reference signal FR1 (see FIG. 5), providing a shortened lock-up time (the time until the output signal VO reaches about the set frequency) which is 1/13 the lock-up time in the conventional PLL circuit provided with a single-stage phase comparator.

Through a repetition of the phase comparisons, the frequency of the output signal VO approaches the set frequency gradually. When the not illustrated first and/or the second detectors detect their input signals to have reached 80% to 95% of the frequency after lock-up in which the frequency of the output signal VO has become nearly equal to the set frequency (referred to as "nearlock" hereinafter), they output signals indicative of that state to the control unit.

The control unit stops the second variable frequency divider 55 and the second phase comparator 38 in response to this signal. On the other hand, the control unit allows the first variable frequency divider 51 and the phase comparator 37 to continue to operate. Thus, the first variable frequency divider 51 and the first phase comparator 37 alone continue to operate to output phase comparison result signals only from the first phase comparator 37 after near lock.

In this manner, the first phase comparator 37 compares the phase of the feedback signal FP1 from the first variable frequency divider 51 with the phase of the reference signal FR1 from the ring counter 35, and outputs the phase comparison result signal to the charge pump 41. The charge pump 41 outputs the error signal ER1 to the low-pass filter 42. The low-pass filter 42 outputs the control voltage CV1 to the voltage-controlled oscillator 50.

Through repetition of the above-described loop interaction, the PLL circuit 31 reaches the lock-up state and delivers stably the output signal VO having the set frequency of 2.08 GHz through the output terminal 44 connected to the output of the voltage-controlled oscillator 50.

As described above, in the PLL circuit according to the third embodiment, after detection of near lock, the first variable frequency divider 51, which can output the accurate feedback signal FP1 since it performs frequency-division by a larger frequency-division ratio N (an integer), is caused to operate alone, and the first phase comparator 37 constituting the PLL frequency synthesizer 45 performs phase comparisons to output the phase comparison signals.

In consequence, the frequency of the output signal VO matches the set frequency precisely.

Figure 6:
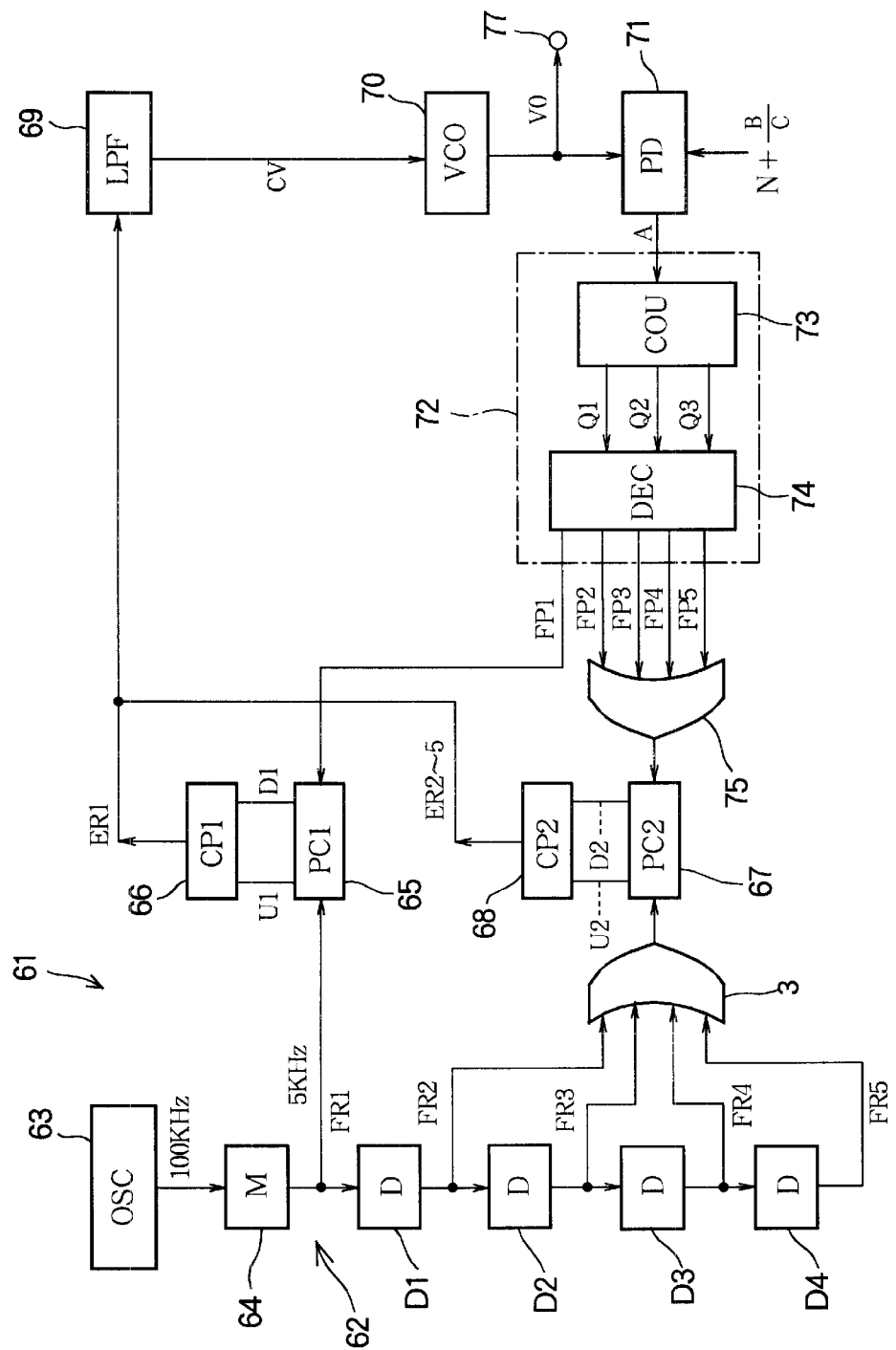
FIG. 6 is a block diagram of a PLL circuit according to a fourth embodiment of the invention.
Figure 7:
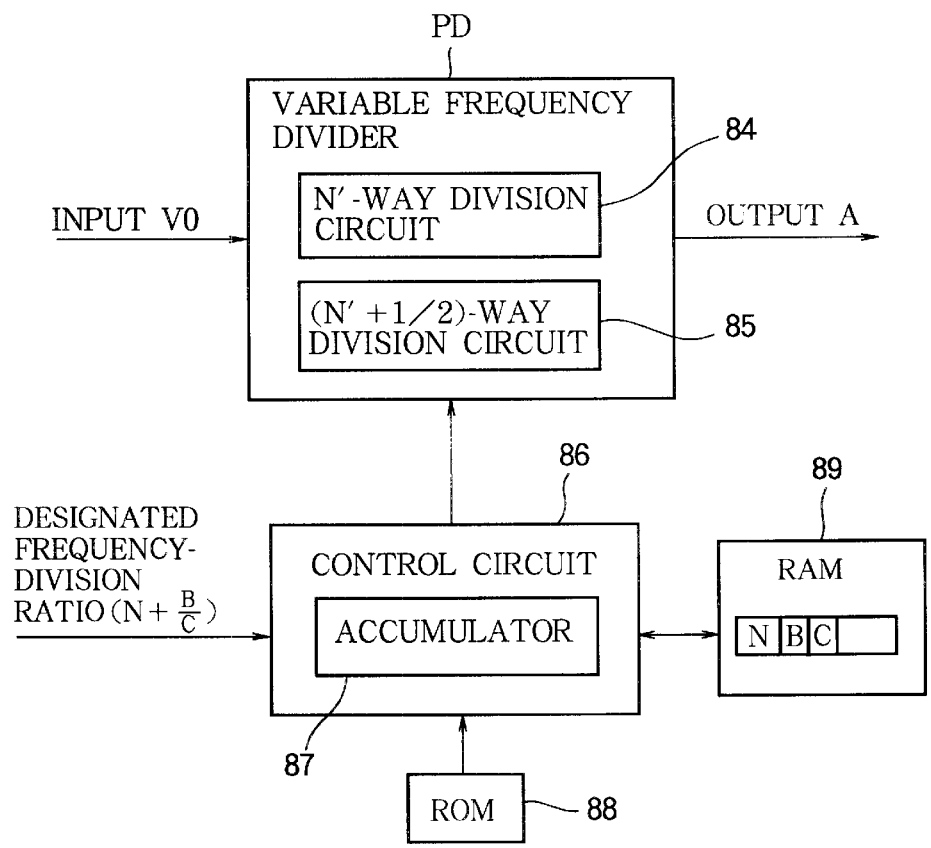
FIG. 7 is a block diagram showing a structure of a variable frequency divider of the PLL circuit of FIG. 6.
Figure 8:
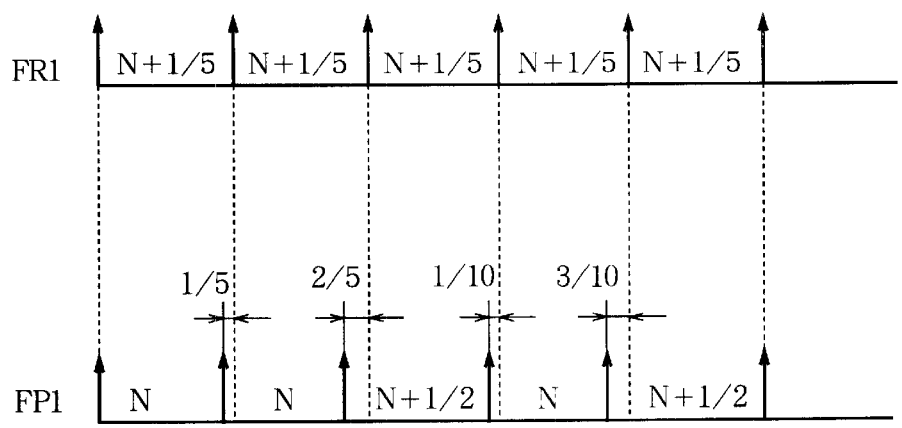
FIG. 8 is a view explaining phase relation between the reference signals and the feedback signals in the PLL circuit of FIG. 6.

A PLL circuit 61 according to the fourth embodiment of the invention will now be described with reference to FIGS. 6 to 8. FIG. 6 is a block diagram of the PLL circuit 61, and FIG. 7 is a block diagram of a variable frequency divider used for this PLL circuit 61.

In these figures, a reference signal producing means 62 is comprised of a reference oscillator 63, a fixed frequency divider 64, and delay circuits D1, D2, D3, and D4. The fixed frequency divider 64, which is for dividing a signal of 100 kHz signal output from the reference oscillator 63 by 20 for example, is connected between the reference oscillator 63 and the delay circuit D1. The fixed frequency divider 64 outputs a reference signal FR1 of 5 KHz obtained by dividing the frequency of a signal output from the reference oscillator 63 by 20 to a first phase comparator 65.

The delay circuit D1 delays the reference signal FR1 by 1/5 the period of the reference signal FR1, and supplies it to an OR gate 3 as a reference signal FR2. The delay circuit D2 delays the reference signal FR1 by 2/5 the period of the reference signal FR1, and supplies it to the OR gate 3 as a reference signal FR3.

The delay circuit D3 delays the reference signal FR1 by 3/5 the period of the reference signal FR1, and supplies it to the OR gate 3 as a reference signal FR4. The delay circuit D4 delays the reference signal FR1 by 4/5 the period of the reference signal FR1, and supplies it to the OR gate 3 as a reference signal FR5. In this manner, the reference signal producing means 62 produces the plurality of the reference signals FR1 to FR5 having different phases, and outputs them to the OR gate 3.

A variable frequency divider 71 is a circuit which divides the frequency of an output signal VO from a voltage-controlled oscillator 70 by a frequency-division ratio of N+B/C (where N, B and C are integers, and B≦C), that is, which divides the frequency of the output signal VO into 1/(N+B/C) to output an intermediate signal A.

As shown in FIG. 7, the variable frequency divider 71 includes an N'-way division circuit 84 for performing frequency-division by a frequency-division ratio N' (N' being an integer), and an (N'+1/2)-way division circuit 85 for performing frequency-division by a frequency-division ratio N'+1/2. Although the N'-way division circuit 84 and the (N'+1/2)-way division circuit 85 are shown as separate and different circuits to simplify explanation in FIG. 7, actually, they are in one circuit that performs either one of the N'-way division and the (N'+1/2)-way division selectively in accordance with a control signal from the below-described control circuit 86.

The control circuit 86 includes an accumulator 87 for adding N and B/C in order to control the variable frequency divider 71 in accordance with the frequency-division ratio of N+B/C designated from the outside. A ROM 88 stores a control program used for the control circuit 86 to operate. A RAM 89 stores data (N, B, C, etc.) used for preparing data on frequency-division ratios.

As a counter 73, a counter having about the same structure as the counter 44a disclosed in the Japanese Patent Application No. 11-201752 filed by the same applicant as the present application may be used. However, detailed explanation will be omitted since it has not direct connection with the present invention. In brief, the counter 73 is comprised of cascaded toggle flip-flops. The toggle flip-flops output signals Q1, Q2, Q3, and Q4 respectively.

The signal Q1 is the intermediate signal A with its frequency divided by 2, the signal Q2 is the intermediate signal A with its frequency divided by 4, and the signal Q3 is the intermediate signal A with its frequency divided by 8. In this manner, the counter 73 outputs the signals Q1, Q2, Q3, and Q4 to a decoder 74.

The decoder 74 has an input connected to the output of the counter 73. As the decoder 74, a circuit having about the same structure as the distributing circuit 32 disclosed in the Japanese Patent Application No. 11-201752 filed by the same applicant as the present application may be used. However, detailed explanation will be omitted since it has not direct connection with the present invention.

In brief, the decoder 74 is comprised of three conductors and five AND gates. The three conductors are connected to the signals Q1, Q2, and Q3 respectively. The three conductors are respectively connected to a first, a second, and a third input terminals of each of the AND gates.

The first to the third input terminals of each of the AND gates are provided with an input-inverting capability (an inverter) as necessary. The AND gates outputs feedback signals FP1 to FP5 respectively.

The feedback signals FP2 to FP5 are input to an OR gate 75. The OR gate 75 supplies the feedback signals FP2 to FP5 produced by the variable frequency divider 71, the counter 73 and the decoder 74 to one input of a second phase comparator 67 in succession. The counter 73, the decoder 74, etc. constitute a distributing circuit 72.

The plurality of reference signals FR2 to FR5 produced by the reference signal producing means 62 are supplied to the other input of the second phase comparator 67 by way of the OR gate 3 in succession.

The second phase comparator 67 compares the phases of the reference signals FR2 to FR5 with the phases of the feedback signals FP2 to FP5, and outputs a plurality of phase comparison result signals (pump-up signals) U2 to U5 or a plurality of phase comparison result signals (pump-down signals) D2 to D5 to a charge pump 68. The charge pump 68 produces error signals ER2, ER3, ER4, ER5 according to the plurality of the phase comparison result signals U2 to U5 or D2 to D5.

The feedback signal FP1 is supplied to the other input of the first phase comparator 65. In this manner, the first phase comparator 65 compares the phase of the reference signal FR1 with the phase of the feedback signal FP1, and outputs the phase comparison result signal U1 or D1 to a charge pump 66.

The charge pump 66 outputs an error signal ER1 to a low-pass filter 69 in response to the phase comparison result signal U1 or D1.

The low-pass filter 69 produces a control voltage CV by cutting high frequency components of the error signals ER1, ER2, ER3, ER4 and ER5, and outputs it to the voltage-controlled oscillator 70.

The voltage-controlled oscillator 70 produces the output signal VO having a frequency responsive to the control voltage CV. The output signal VO is output to the variable frequency divider 71 and to an external apparatus (not shown) by way of an output terminal 77.

Next, the operation of this PLL circuit 61 will be explained with reference to FIGS. 6 to 8. In these figures, suppose that a user selects a frequency of 1001 kHz by a frequency setting key (not shown), and presses a start key. Here, assume that the user can select a frequency in increments of 1 kHz as 1001 kHz, 1002 kHz, 1003 KHz . . . That is, assume that the channel spacing frequency (channel space) is 1 kHz.

In this case, the control circuit 86 determines a frequency-division ratio to be set in the variable frequency divider 71 by calculating N+B/C=200+1/5 in response to the set frequency of 1001 kHz. That is, it is determined that N=200, B=1, and C=5. As described above, the frequency-division ratio to be set in the variable frequency divider 71 can be determined as a value (200+1/5) obtained by dividing the frequency 1001 kHz of the output signal VO by the frequency 5 kHz of the reference signals FR1 to FR5.

The reference signal producing means 62 outputs the five reference signals FR1 to FR5 having the frequency of 5 KHz and spaced by 1/5 the period.

Then, the control circuit 86 controls the variable frequency divider 71 to produce an output (intermediate signal A) for the first time around by the N'-way division circuit 84, produce an output for the second time around by the N'-way division circuit 84 as well, produce an output for the third time around by the (N'+1/2)-way division circuit 85, an output for the fourth time around by the N'-way division circuit 84, and an output for the fifth time around by the (N'+1/2)-way division circuit 85.

In a case where the frequency of the output signal VO is equal to 1001 kHz, since the frequency-division ratio of the variable frequency divider 71 is 200 when the intermediate signal A is output for the first time around, there arises an error of 1/5 (a phase difference of 1/5 the period of 5 kHz) between the reference signal and the feedback signal, for example between the reference signal FR1 (5 kHz) and the feedback signal FP1. When the output is made for the second time around, the error becomes 1/5+1/5=2/5. When the output is made for the third time around, the error becomes 2/5−1/2+1/5=1/10, since the frequency-division ratio of the variable frequency divider 71 switches to 200+1/2. When the output is made for the fourth time around, the error becomes 1/10+1/5=3/10, since the frequency-division ratio of the variable frequency divider 71 returns to 200. When the output is made for the fifth time around, the error becomes 3/10−1/2+1/5=0, since the frequency-division ratio of the variable frequency divider 71 switches to 200+1/2 again. FIG. 8 shows the situation of such changes of the error.

As described above, in this structure, the timing at which the feedback signal FP1 is output coincides with the timing at which the reference signal FR1 is output one time out of five (when the output is made for the fifth time around in this embodiment). That is, by setting appropriately the sequence in which the N'-way division circuit 84 and the (N'+1/2)-way division circuit 85 produce an output, it is possible to perform phase comparisons accurately one time out of five.

Although the above explanation is for the case of (200+1/5)-way division, it is possible to perform phase comparison accurately one time out of five in the cases of (200+2/5)-way division, (200+3/5)-way division, (200+4/5)-way division, and (200+5/5)-way division as well by combining 200-way division and (200+1/2)-way division appropriately. Speaking more generally, when (N+B/C) -way division is to be performed, the timing at which the feedback signal FP1 is output coincides with the timing at which the reference signal FR1 is output one time out of C by setting appropriately the sequence in which the N'-way division circuit 84 and the (N'+1/2)-way division circuit 85 produce an output. That is, it is possible to perform phase comparisons accurately every C outputs of the feedback signal FP1.

Thus, the variable frequency divider 71 can substantially divide the frequency of the output signal VO from the voltage-controlled oscillator 70 by (200+1/5), and output the intermediate signal A obtained by this frequency-division to the first phase comparator 65 as the feedback signal FP1 by way of the distributing circuit 72.

In the same manner, the intermediate signal A is output to the second phase comparator 67 in succession as the feedback signals FP2 to FP5 by way of the distributing circuit 72 and the OR gate 75.

The first phase comparator 65 compares the phase of the reference signal FR1 with the phase of the feedback signal FP1, and outputs the phase comparison result signal (U1, D1) to the charge pump 66. The second phase comparator 67 compares the phases of the reference signals FR2 to FR5 with the phases of the feedback signals FP2 to FP5, and outputs the plurality of the phase comparison result signals (U2 to U5, D2 to D5) to the charge pump 68.

The charge pumps 66 and 68 output the error signals ER1 to ER5 to the low-pass filter 69 in response to the phase comparison result signals. The low-pass filter 69 outputs the control voltage CV to the voltage-controlled oscillator 70 in response to these error signals. In consequence, the phase and the frequency of the output signal VO output from the voltage-controlled oscillator 70 approach the phase and the frequency of the reference signals FR1 to FR5. Such a phase comparison process is repeated.

As described above, since all the phase comparison result signals are output at the start of the lock-up process to perform phase comparisons 5 times during one period of the reference signals, the lock-up time is shortened to 1/5 that of the conventional PLL circuit provided with a single-stage phase comparator.

Through repetition of such phase comparisons, the frequency of the output signal VO approaches the set frequency gradually. When a not illustrated first detector of the first phase comparator 65 and/or a not illustrated second detector of the second phase comparator 67 detect their input signals to have reached 80% to 95% of the frequency after lock-up in which the frequency of the output signal VO has become nearly equal to the set frequency (referred to as "near lock" hereinafter), they output signals indicative of that state to the control circuit 86.

The control circuit 86 stops the second phase comparator 67 in response to this signal, while allowing the first variable frequency divider 71 and the first phase comparator 65 to continue to operate. That is, only the phase comparison result signals U1 or D1 output from the first phase comparator 65 are output after detection of near lock.

Through repetition of the above-described loop interaction, the PLL circuit 61 reaches the lock-up state and delivers stably the output signal VO having the set frequency go of 1001 kHz through the output terminal 77.

In the fourth embodiment, it is permissible that all the phase comparison result signals are output at the start of the lock-up process, and only the phase comparison result signal U1 or D1 is output after lock-up (after the output signal VO nearly reaches the set frequency).

In the fourth embodiment, it is also permissible that the phase comparison is performed one time by a single phase comparator. In this case, in FIG. 6, the intermediate signal A output from the variable frequency divider 71 is supplied to the first phase comparator 65 as the feedback signal FP1. Accordingly, the delay circuits D1 to D4, the OR gate 3, the second phase comparator 67, the charge pump 68, the OR gate 75, the distribution circuit 72, etc are removed.

A brief explanation of a structure in which the phase comparison is performed one time by a single phase comparator as described above will be given below. A reference signal producing means 2 is provided for producing the reference signal FR1. The variable frequency divider 71 is provided for dividing the frequency of the output signal VO from the voltage-controlled oscillator 70 by a frequency-division ratio of N+B/C (where N, B, and C are integers, and B≦C) to output the feedback signal FP1. The single phase comparator 65 is provided for comparing the phase of the reference signal FR1 with the phase of the feedback signal FP1. With this structure as well, it is possible to perform accurate phase comparisons one time out of C.

INDUSTRIAL APPLICABILITY

The PLL circuit according to the first embodiment of the invention comprises a PLL frequency synthesizer (13) including a first variable frequency-dividing means (8), and a second frequency-dividing means (9), a plurality of phase comparison signals (ER1 to ER13) being produced from outputs of the first and the second variable frequency-dividing means, at least one of the outputs of these variable frequency-dividing means being locked in phase accurately.

With the above structure, since the plurality of the phase comparison signals are output to perform phase comparisons a plurality of times during one period of a reference signal, the lock-up time is shortened. Besides, frequency-division of an output signal is performed by the first and the second frequency-dividing means, it is not necessary to have four or more means as previously. The cost is therefore low, LSI implementation is easy, and the amount of power consumed is small. Moreover, since at least one of the outputs of these variable frequency-dividing means is locked in phase accurately in this structure, the frequency of the output signal matches a set frequency precisely.

The second variable frequency-dividing means (9) may be formed from a variable frequency divider (10) and/or a counter (11).

With this structure, since a plurality of feedback signals are produced by the first variable frequency-dividing means, a counter, and/or a variable frequency divider, it is not necessary to have variable frequency dividers for each of the feedback signals as previously. As a result, a space taken by these parts can be small, and LSI implementation is therefore easy.

The PLL circuit according to the first embodiment may include a producing means (2) for producing a plurality of reference signals (FR1 to FR13) having different phases, a voltage-controlled oscillator (6) and phase comparators (A1 to A13, B1 to B13), the first and the second variable frequency-dividing means (8, 9) dividing the frequency of the output signal of the voltage-controlled oscillator (6) to produce a plurality of feedback signal (FP1 to FP13), the phase comparators comparing the phases of the feedback signals with the phases of the reference signals to output the plurality of the phase comparison signals (ER1 to ER13)

With this structure, since phase comparisons are performed a plurality of times (equal to the number of the phase comparison signals) during one period of the reference signals by comparing the plurality of the reference signals having different phases with the feedback signals, the lock-up time is shortened.

It is possible that all of the phase comparison signals are output at the start, and a specific one of the phase comparison signals is output after near lock.

With this structure, since all of the phase comparison signals are output at the start, phase comparisons are performed a plurality of times during one period of the reference signals, the lock-up time is shortened. Besides, since a specific phase comparison signal is output after near lock, phase comparisons are performed accurately, and therefore the frequency of the output signal matches the set frequency precisely.

It is possible to cause the first and the second variable frequency-dividing means (8, 9) to operate at the start, and cause only the first variable frequency-dividing means (8) to continue to operate after near lock.

With this structure, since the first and the second variable frequency-dividing means are caused to operate at the start, phase comparisons are performed a plurality of times during one period of the reference signals, and therefore the lock-up time is shortened. Besides, since only the first frequency dividing means is caused to operate after near lock, phase comparisons can be performed accurately, and therefore the frequency of the output signal matches the set frequency precisely. Moreover, since the second variable frequency-dividing means is caused to stop at that time, power consumption is reduced.

The PLL circuit according to the second embodiment of the invention comprises a producing means (2) including a reference oscillator (3) for producing a plurality of reference signal (FR1 to FR13) having different phases, a variable frequency-dividing means (8, 9) for dividing the frequency of an output signal of a voltage-controlled oscillator (6) to output a plurality of feedback signals (FP1 to FP13), and phase comparators (A1 to A13) for comparing the phases of the plurality of the reference signals with the phases of the plurality of the feedback signals, the number of the reference signals is set such that a quotient of (an oscillation frequency of the reference oscillator)/(a desired channel spacing frequency) is equal to the number of the reference signals.

With this structure, any desired channel spacing frequency can be obtained by selecting the number of the reference signals appropriately. Besides, since phase comparisons are performed a plurality of times during one period of the reference signals, the lock-up time is shortened.

A fixed frequency divider (4) may be provided between the reference oscillator (3) and the phase comparators (A1 to A13) so that the number of the reference signals can be set to a value (an integer) equal to the quotient divided by a frequency-division ratio of the fixed frequency divider.

With this structure, it is possible to reduce the number of the reference signals while obtaining any desired channel spacing frequency by the provision of the fixed frequency divider. As a result, the number of the delay circuits or the number of the phase comparators can be reduced to simplify the structure and lower the cost.

The number of the phase comparators (A1 to A13) may be set to be equal to the above-described quotient or the above-described value.

With this structure, the number of the phase comparators is identical to the number of the reference signals, and the phase comparators can perform phase comparisons accurately.

By selecting one reference signal from among the plurality of the reference signals (FR1 to FR13) in succession, selecting one feedback signal from among the plurality of the feedback signals (FP1 to FP13) in succession, and comparing the phases of the selected signals, it is possible to form the phase comparators as a single phase comparator.

With this structure, since it is possible to perform phase comparisons for each of the reference signals having different phases by use of a single phase comparator, the cost is reduced. Furthermore, when the PLL circuit is implemented as an LSI, the LSI can be small-sized since it has only one phase comparator.

The PLL circuit according to the third embodiment of the invention comprises a producing means (32) for producing a plurality of reference signals (FR1 to FR13) having different phases, a variable frequency-divider (59) for dividing the frequency of an output of a voltage-controlled oscillator (50) to produce feedback signals (FP1 to FP13), and phase comparators (37, 38) for comparing phases of the feedback signals with phases of the reference signals respectively to produce n (n being an integer equal to or larger than 2) phase comparison signals (U1 to U13, D1 to D13), the variable frequency-divider being supplied with frequency-division data according to n.

With this structure, since the plurality of the phase comparison signals are output so that phase comparisons are performed a plurality of times during one period of the reference signals, the lock-up time is shortened. Furthermore, since the variable frequency-divider is supplied with the frequency-division data obtained by processing the number (n) of the reference signals, it is possible to determine the number of the feedback signals and the number of the reference signals according to the number n of the phase comparison signals. By selecting the number of the reference signals (13 in this embodiment) in this manner, it is possible to obtain a desired reference frequency (a channel space which is 200 kHz in this embodiment) that is a frequency of an input signal (13 MHz/5=2.6 MHz in this embodiment) divided by the number of the reference signals.

The variable frequency divider (59) may be constituted by a first variable frequency divider (51) and a second variable frequency divider (55), a PLL frequency synthesizer (45) including the first frequency divider may be provided, the first variable frequency divider may be supplied with frequency-division data N, and the second variable frequency divider may be supplied with frequency-division data N/n.

With this structure, since the second variable frequency divider is supplied with the frequency-division data N/n (n being. the number of the phase comparison signals), the number of the phase comparison signals can be equal to the number of the feedback signals. Accordingly, a plurality of phase comparisons can be performed equally, and therefore phase comparison can be performed accurately.

By outputting the plurality of the feedback signals (FP2 to FP13) from the second variable frequency divider (55) one by one in succession, outputting the plurality of the reference signals (FR2 to FR13) one by one in succession, and comparing the phases of the output signals, it is possible to deliver the plurality of the phase comparison signals (U2 to U13, D2 to D13).

With this structure, since the output signal is divided by the first and the second variable frequency dividers, it is not necessary to have as many as 13 frequency dividers as previously. The cost is therefore low, LSI implementation is easy, and the amount of power consumed is small. Furthermore, since this structure requires only 2 phase comparators at most, it is not necessary to have as many as 13 phase comparators as previously. The cost is therefore low, and LSI implementation is easy.

The first variable frequency divider (51) and/or the second variable frequency divider (55) may be comprised of a pulse swallow counter (53, 57). In this structure, the variable frequency divider is formed from a 2-factor pre-scaler and a variable frequency-dividing part. Since the variable frequency-dividing part can perform frequency-division by a relatively small frequency-division ratio, the one with a low frequency-division power is plenty good enough, and the cost is therefore low. Furthermore, by use of the 2-factor pre-scaler, any frequency-division ratio can be obtained by switching only between two ratios, propagation delay can be reduced, and the operation speed is therefore fast. For the reasons above, output signals of higher frequency can be treated easily.

The PLL circuit according to the fourth embodiment of the invention comprises a producing means (62) for producing reference signals (FR1 to FR5), a variable frequency divider (71, 72) for dividing the frequency of an output of a voltage-controlled oscillator (70) by a frequency-division ratio of N+B/C (where N, B and C are integers, and B≦C) to output feedback signals (FP1 to FP5), and phase comparators (65, 67) for comparing phases of the reference signals with phases of the feedback signals, phase comparisons being performed accurately one time out of C.

With this structure, since frequencies can be divided by a fraction, it is possible to use a relatively high reference frequency even when a relatively small channel spacing frequency is required so that the lock-up time is shortened. Furthermore, since the PLL circuit of the frequency-division-by-fraction type performs phase comparisons accurately one time out of C, a high C/N ratio can be obtained.

The variant of the fourth embodiment comprises a producing means (62) for producing a plurality of reference signals (FR1 to FR5) having different phases, a variable frequency divider (71, 72) for dividing the frequency an output of a voltage-controlled oscillator (70) by a frequency-division ratio of N+B/C (where N, B and C are integers and B≦C) to output a plurality of feedback signals (FP1 to FP5), phase comparators (65, 67) for comparing phases of the reference signals with phases of the feedback signals to output a plurality of phase comparison signals (U1 to U5, D1 to D5), phase comparisons being performed accurately one time out of C.

With this structure, since the plurality of the phase comparison signals are output, phase comparisons are performed a plurality of times during one period of the reference signals so that the lock-up time is shortened. Furthermore, since a single variable frequency divider is plenty good enough for performing a plurality of phase comparisons, the cost is low, LSI implementation is easy, and the amount of power consumed is small. Furthermore, since in the PLL circuit of the frequency-division-by-fraction type, phase comparisons are performed accurately one time out of C, a high C/N ratio can be obtained.

All the phase comparison signals (U1 to U5, D1 to D5) may be output at the start, and only the phase comparison signal (U1, D1) resulting from the accurate phase comparison may be output after near lock or after lock-up.

With this structure, since all the phase comparison signals are output at the start, the lock-up time is shortened. Besides, since only the phase comparison signal resulting from the accurate phase comparison is output after near lock or after lock-up, it is possible to prevent the plurality of the phase comparison signals from interfering with each so that phase comparisons can be performed accurately to make the C/N ratio higher.

The frequency of the reference signal (FR1 to FR5) may be the same as the channel spacing frequency multiplied by C.

With this structure, it is possible to use, even when a relatively low channel spacing frequency is required, a relatively high reference frequency (the channel spacing frequency multiplied by C in the PLL circuit of the frequency-division-by-fraction type so that a large number of phase comparisons are performed per unit time to shorten the lock-up time.

What is claimed is:

1. A PLL circuit comprising a producing means (62) for producing reference signals (FR1 to FR5), a variable frequency divider (71, 72) for dividing a frequency of an output signal of a voltage-controlled oscillator (70) by a frequency-division ratio of N+B/C (where N, B and C are integers, and B≦C) to output feedback signals (FP1 to FP5), a phase comparator (65, 67) for comparing phases of the reference signals with phases of the feedback signals, phase comparisons being performed accurately one time out of C.

2. A PLL circuit comprising a producing means (62) for producing a plurality of reference signals (FR1 to FR5) having different phases, a variable frequency divider (71, 72) for dividing a frequency of an output signal of a voltage-controlled oscillator (70) by a frequency-division ratio of N+B/C (where N, B and C are integers, and B≦C) to output a plurality of feedback signals (FP1 to FP5), phase comparators (65, 67) for comparing phases of the reference signals with phases of the feedback signals to output a plurality of phase comparison signals (U1 to U5, D1 to D5), phase comparisons being performed accurately one time out of C.

3. A PLL circuit according to claim 2, in which a frequency of the reference signals (FR1 to FR5) is the same as a channel spacing frequency multiplied by C.

4. A PLL circuit according to claim 2, in which all the phase comparison signals (U1 to U5, D1 to D5) are output at the start, and only the phase comparison signal (U1, D1) resulting from an accurate phase comparison is output after near lock or after lock-up.

5. A PLL circuit according to claim 4, in which a frequency of the reference signals (FR1 to FR5) is the same as a channel spacing frequency multiplied by C.

* * * * *